(12) United States Patent
Yoshizumi et al.

(10) Patent No.: US 8,772,820 B2
(45) Date of Patent: Jul. 8, 2014

(54) LIGHT-EMITTING DEVICE AND MANUFACTURING METHOD THEREOF

(75) Inventors: Kensuke Yoshizumi, Kanagawa (JP); Koji Ono, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 143 days.

(21) Appl. No.: 13/430,974

(22) Filed: Mar. 27, 2012

(65) Prior Publication Data

US 2012/0248489 A1    Oct. 4, 2012

(30) Foreign Application Priority Data

Mar. 30, 2011    (JP) ................................. 2011-075866

(51) Int. Cl.
*H01L 33/00*    (2010.01)

(52) U.S. Cl.
USPC ........................................................ 257/99

(58) Field of Classification Search
CPC . H01L 51/5203; H01L 51/56; H01L 51/5012; H01L 51/0058; H01L 51/0072
USPC ............. 257/252–254, 257–258, 13, 79–103, 257/918, E33.001–E33.077, 40, 642–643, 257/759, E51.001–E51.052, 257/E25.008–E25.009, E39.007, 257/E27.117–E27.119; 438/21–47, 69, 438/493, 503
See application file for complete search history.

(56) References Cited

U.S. PATENT DOCUMENTS

| 7,161,184 B2 | 1/2007 | Miyagi et al. |
| 7,834,543 B2 | 11/2010 | Takata |
| 7,943,938 B2 | 5/2011 | Miyagi et al. |
| 7,999,463 B2 | 8/2011 | Nomura |
| 2003/0060055 A1 | 3/2003 | Kamijima |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2011/0210335 A1 | 9/2011 | Miyagi et al. |
| 2012/0199869 A1* | 8/2012 | Tsurume ......................... 257/99 |
| 2012/0256204 A1* | 10/2012 | Yoshizumi et al. .............. 257/88 |
| 2012/0298973 A1* | 11/2012 | Adachi et al. ................... 257/40 |
| 2013/0112955 A1* | 5/2013 | Yamazaki et al. .............. 257/40 |

FOREIGN PATENT DOCUMENTS

| JP | 11-97183 | 4/1999 |
| JP | 2009-130132 | 6/2009 |
| JP | 4664604 B2 | 4/2011 |

* cited by examiner

*Primary Examiner* — Dao H Nguyen
*Assistant Examiner* — Tram H Nguyen
(74) *Attorney, Agent, or Firm* — Husch Blackwell LLP

(57) ABSTRACT

A highly reliable light-emitting device, a light-emitting device which can be formed without using a metal mask, or a light-emitting device in which a voltage drop due to the resistance of an upper electrode layer is suppressed is provided. When an EL film is formed over a conductive connection electrode layer having an uneven shape, a surface of the conductive connection electrode layer cannot be fully covered. Subsequently, a conductive film to be an upper electrode layer of an EL element is formed thereover; thus, a region in contact with the conductive connection electrode layer is formed. Further, a structure is provided in a position on a counter substrate, which overlaps with the conductive connection electrode layer, and then substrates are bonded to each other so that the structure is physically in contact with the upper electrode layer over the conductive connection electrode layer.

9 Claims, 10 Drawing Sheets

LIGHT-EMITTING DEVICE AND MANUFACTURING METHOD THEREOF

BACKGROUND OF THE INVENTION

1. Field of the Invention

The present invention relates to a light-emitting device including an organic EL element and a manufacturing method thereof.

2. Description of the Related Art

An organic EL element has been actively researched and developed. In the fundamental configuration of the organic EL element, a layer containing a light-emitting organic compound is provided between a pair of electrode layers. By voltage application to this element, light emission from the light-emitting organic compound can be obtained.

The organic EL element can be formed into a film shape; thus, a large-area element can easily be formed. Accordingly, the organic EL element has a high utility value as a surface light source that can be applied to lighting or the like.

For example, a lighting equipment including an organic EL element is disclosed in Patent Document 1.

As for an organic EL element, there are a top emission type in which light is extracted to the side of a substrate, on which an organic EL element is formed; a bottom emission type in which light is extracted to the side of the substrate, which is opposite to the side on which the organic EL element is formed; and a dual emission type in which light emission is extracted to the both sides.

REFERENCE

Patent Document

[Patent Document 1] Japanese Published Patent Application No. 2009-130132

SUMMARY OF THE INVENTION

In the case where an organic EL element (hereinafter, also referred to as an EL element or a light-emitting element) is included in a lighting device, a voltage drop due to the resistance of an upper electrode layer and/or a lower electrode layer of the EL element tends to be significant as the area of a light-emitting portion increases. When the voltage drop is significant, there is a problem in that luminance gradient might be seen. In order to prevent such a problem, the upper electrode layer or the lower electrode layer needs to be provided with an auxiliary electrode for assistance (also referred to as an auxiliary wiring) which is formed using a material having low resistivity.

In particular, a light-transmitting material which is used for a transparent electrode on a light extraction side has relatively high resistance; thus, the need for providing an auxiliary electrode is high. However, particularly in the case of a top-emission (including a dual-emission) EL element in which light is extracted to a side opposite to a substrate side, a pattern of an auxiliary electrode layer needs to be fainted after formation of the EL element; accordingly, the EL element might be damaged in some cases. For example, in the case where a conductive film to be the auxiliary electrode layer is formed by a sputtering method, there is a concern about thermal or physical damage. Further, optical or thermal damage, melting of an EL element due to an organic solvent or the like in removal of a resist, or the like can be given as a problem in the case where the conductive film is processed by a photolithography method or the like.

Here, as a method for stacking a layer containing a light-emitting organic compound and an upper electrode layer in that order over a lower electrode layer formed over a substrate having an insulating surface in forming an EL element, a vacuum evaporation method is given, for example. As a method for forming an island-shaped layer using a vacuum evaporation method, a method using a metal mask (also referred to as a shadow mask), which is a metal plate provided with an opening, is known. A metal mask is provided between a substrate and an evaporation source to be in contact with the substrate, and evaporation is performed on the substrate through an opening in the metal mask, whereby a pattern having a shape in accordance with the shape of the opening can be formed. Note that when the distance between a metal mask and a substrate is short, an island-shaped layer can be formed with a clear shape based on an opening; in other words, a shape whose periphery is less obscure.

On the other hand, the probability of the occurrence of problems becomes high when a metal mask is used in contact with a substrate. For example, a surface of the substrate is damaged by an edge of an opening portion in a metal mask in some cases. Specifically, at the time of making a metal mask to be in contact with a substrate, the metal mask rubs the surface of the substrate, so that another layer, which has been formed on the substrate, is broken in some cases. In particular, in the case where an edge of an opening portion in a metal mask overlaps with a region close to a light-emitting region, an EL element might be short-circuited. Further, dust attached to a metal mask (including a small foreign substance referred to as a particle) is transferred from the metal mask to a substrate in some cases.

In addition, when a large metal mask for a large substrate is used, a problem in that a pattern is displaced owing to a bend or the like of a metal plate used as the metal mask might arise. When the thickness of the metal plate is increased to prevent such a problem, there are problems in that the outer edge portion of a formed island-shaped pattern is obscure, and it is difficult to handle a metal mask whose weight is significantly increased.

The present invention is made in view of the foregoing technical background. Thus, it is an object of one embodiment of the present invention to provide a highly reliable light-emitting device. It is a further object to provide a light-emitting device which can be formed without using a metal mask. It is a still further object to provide a light-emitting device in which a voltage drop due to the resistance of an upper electrode layer is suppressed.

One embodiment of the present invention achieves at least one of the above objects.

To achieve any of the above objects, the present invention focuses on coverage of a film to be formed. When a film is formed over a very uneven surface, the surface cannot be fully covered, so that part of the film is physically separated in some cases.

When a conductive connection electrode layer having an uneven surface is formed and an EL film is formed thereover, the surface of the connection electrode layer cannot be fully covered, so that a region where part of the surface of the connection electrode layer is exposed is formed. Subsequently, a conductive film to be an upper electrode layer of an EL element is formed thereover; thus, a region where the conductive film is in contact with the exposed portion of the surface of the connection electrode layer is formed.

Further, a structure is provided in a position which overlaps with the connection electrode layer and is on a counter substrate, and then the counter substrate is bonded to a substrate so that the structure presses and is in contact with the upper electrode layer over the connection electrode layer. Accordingly, the upper electrode layer and the connection electrode layer can be connected to each other without fail and the contact resistance therebetween can be further reduced.

That is, one embodiment of the present invention is a light-emitting device including a light-emitting element in which a first electrode layer, a layer containing a light-emitting organic compound, and a second electrode layer are stacked. The second electrode layer is provided between a structure and a conductive connection electrode layer having an uneven surface. Further, the second electrode layer is electrically connected to the connection electrode layer.

With such a configuration, even when an EL layer is provided between an upper electrode layer (second electrode layer) of an EL element and the connection electrode layer, a light-emitting device including the connection electrode layer which is electrically connected to the upper electrode layer without fail can be provided. Thus, the upper electrode layer can be stacked over the EL layer without using a metal mask and a problem caused by a metal mask can be prevented. A connection portion having such a configuration can be provided in a region where the upper electrode layer is formed.

Further, the above configuration can be applied, for example, to an auxiliary electrode for substantially increasing the conductivity of the upper electrode layer of the EL element. In that case, a lower electrode layer (first electrode layer) of the EL element may be provided so as to be electrically insulated from the connection electrode layer having an uneven shape. The lower electrode layer is insulated from the connection electrode layer, whereby the upper electrode layer (second electrode layer) of the EL element which is electrically connected to the connection electrode layer can be used as an auxiliary electrode layer. Thus, a highly reliable light-emitting device which can be manufactured without using a metal mask and in which a voltage drop due to the resistance of the upper electrode is suppressed can be obtained.

Furthermore, the structure provided over the counter substrate may contain a material (also referred to as a desiccant) which absorbs moisture. Since a region overlapping with the structure is a non-light-emitting region, particularly in the case of a top-emission EL device, a desiccant can be introduced into a sealed region without reducing the area of a light-emitting region; thus, a highly reliable light-emitting device having high emission efficiency can be obtained.

Another embodiment of the present invention is the light-emitting device in which the connection electrode layer may be provided over the first electrode layer with an insulating layer provided therebetween.

When the connection electrode layer is formed over the lower electrode layer with the insulating layer provided therebetween, the connection electrode layer is electrically insulated from the lower electrode layer by the insulating layer. Thus, the connection electrode layer can be used as an auxiliary electrode for substantially increasing the conductivity of the upper electrode layer. Further, since the connection electrode layer can be formed over the lower electrode layer, the area of a non-light-emitting portion caused by such a connection portion can be minimized; thus, a light-emitting device having high emission efficiency can be obtained.

Another embodiment of the present invention is the light-emitting device in which the connection electrode layer may be provided on and in contact with a wiring and the second electrode layer may be electrically connected to the wiring.

The configuration of the connection portion according to one embodiment of the present invention can be applied to a connection portion of the upper electrode layer and a wiring (e.g., a wiring for extracting an electrode to outside the sealed region or a wiring for connecting light-emitting devices) of the light-emitting device provided over the substrate. In that case, the connection electrode layer having the uneven shape may be provided on and in contact with the wiring and the EL layer and the upper electrode layer may be formed over the connection electrode layer.

Alternatively, an electrode layer having an uneven shape, which is formed over an insulating surface, may be used as the wiring of the light-emitting device.

With such a configuration, the wiring of the light-emitting device can be electrically connected to the upper electrode layer of the EL element without fail through the conductive connection electrode layer having the uneven shape; thus, a highly reliable light-emitting device can be manufactured without using a metal mask.

Another embodiment of the present invention is the light-emitting device in which the structure may have conductivity.

Another embodiment of the present invention is the light-emitting device in which an insulating layer and a conductive layer may be stacked to form the structure and the conductive layer may be electrically connected to the second electrode layer.

Note that the structure provided over the counter substrate may have an insulating property or may be formed using a conductive material. Alternatively, the structure may be formed by stacking an insulating material and a conductive material. In the case where the structure provided over the counter substrate has conductivity, the structure serves as an electrode; thus, the resistance of the connection portion can be lowered, and when the connection electrode layer is used as a wiring, the conductivity of the wiring can be substantially increased. In the case of using a conductive material for the structure, similarly to the connection electrode layer formed over the substrate, the structure preferably has a very uneven shape because a contact area with the upper electrode layer can be increased.

With such a configuration, even when an EL film and a conductive film to be the upper electrode layer are formed without using a metal mask, the upper electrode layer can be electrically connected to the connection electrode layer having the uneven shape without fail.

Another embodiment of the present invention is the light-emitting device in which the first electrode layer may reflect light emitted from the layer containing the light-emitting organic compound and the second electrode layer may transmit light emitted from the layer containing the light-emitting organic compound.

In particular, in the case of using a light-transmitting material for the upper electrode layer (second electrode layer) of a top-emission EL element, the light-transmitting material tends to have relatively high resistance. Thus, the connection electrode layer according to one embodiment of the present invention is preferably used as an auxiliary electrode or a connection electrode, whereby the conductivity of the upper electrode layer can be substantially increased without fail.

In a method for manufacturing a light-emitting device according to one embodiment of the present invention, a first electrode layer is formed over a surface of a first substrate, a conductive connection electrode layer having an uneven shape is formed over the surface over which the first electrode layer is formed, a layer containing a light-emitting organic compound is formed over the first electrode layer and the connection electrode layer so that a surface of the connection electrode layer is partly exposed, a second electrode layer is formed over the layer containing the light-emitting organic compound so as to be partly in contact with the surface of the connection electrode layer, a structure is provided on a surface of a second substrate, and the second substrate is bonded to the first substrate so that the structure faces and in contact with the second electrode layer over the connection electrode layer.

With the use of such a method, even when the EL layer and the upper electrode layer which are included in the EL element are formed without using a metal mask, the conductive connection electrode layer can be electrically connected to the upper electrode layer without fail.

Another embodiment of the present invention is the method for manufacturing a light-emitting device, in which after the first electrode layer is formed, an insulating layer may be formed over the first electrode layer and the connection electrode layer may be formed over the insulating layer.

With the use of such a method, the conductive connection electrode layer can be provided as the auxiliary electrode for the upper electrode layer of the EL element, over the first substrate over which the EL element is formed. Further, since the connection electrode layer can be formed before the EL layer and the upper electrode layer are provided, damage to the EL element caused when the auxiliary electrode layer is formed can be prevented. Furthermore, with the use of the above method for forming the auxiliary electrode layer, the EL layer and the upper electrode layer can be formed without using a metal mask; thus, the occurrence of problems caused by the metal mask can be reduced.

Another embodiment of the present invention is the method for manufacturing a light-emitting device, in which a wiring may be formed over the surface over which the first electrode layer is formed before the connection electrode layer is formed, and the connection electrode layer may be formed on and in contact with the wiring.

With the use of such a manufacturing method, a connection portion of the upper electrode layer and a wiring (e.g., a wiring for extracting an electrode to outside the sealed region or a wiring for connecting light-emitting devices) of the light-emitting device provided over the substrate can be formed without using a metal mask.

Another embodiment of the present invention is the method for manufacturing a light-emitting device, in which the structure may be formed using a conductive material.

Another embodiment of the present invention is the method for manufacturing a light-emitting device, in which the structure may be formed by stacking an insulating layer and a conductive layer.

In particular, it is preferable that a structure in which a conductive layer and a conductive layer or an insulating layer are stacked be used as the structure provided on the counter substrate (second substrate) side, because the resistance of the connection portion can be lowered. When the structure has conductivity as described above, the structure can also be used as a wiring.

Note that in this specification and the like, a metal mask is a mask including opening portions for forming a plurality of island-shaped patterns in one light-emitting device. Thus, an area covering mask for providing a region where a film is not formed in a region (e.g., a region overlapping with a sealed region) on the side sufficiently outer than a light-emitting region of a light-emitting device, or in a region between adjacent light-emitting devices is not a metal mask. Note that in the case where a plurality of light-emitting devices is formed over a substrate, the area covering mask may include an edge of an opening portion, which overlaps with a wiring, depending on a layout of the light-emitting devices.

Note that in this specification, an EL layer is a layer (also referred to as a light-emitting layer) containing at least a light-emitting organic compound or is a stack including a light-emitting layer, which is provided between a pair of electrodes of a light-emitting element.

According to one embodiment of the present invention, a highly reliable light-emitting device can be provided. Specifically, a light-emitting device in which a voltage drop due to the resistance of an upper electrode layer is suppressed can be provided. Further, a light-emitting device which can be manufactured without using a metal mask can be provided.

DETAILED DESCRIPTION OF THE INVENTION

Figure 1A:
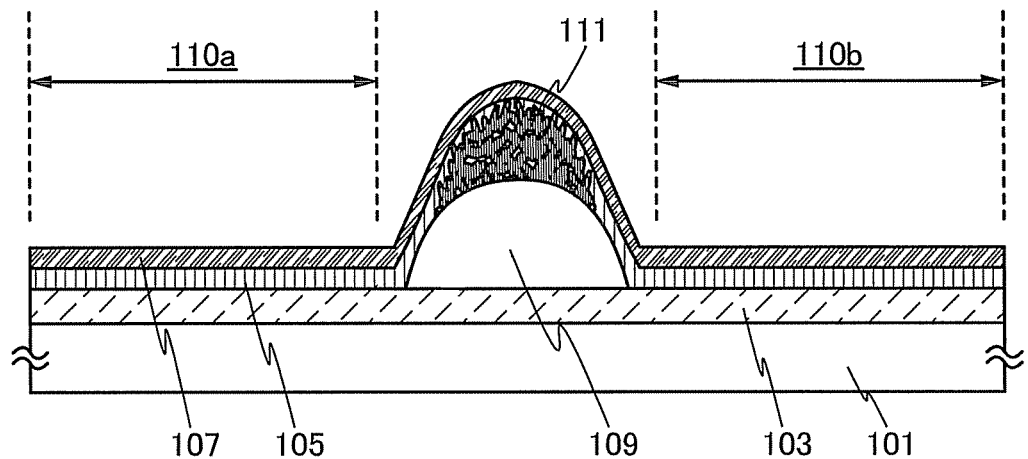
FIGS. 1A to 1C illustrate a light-emitting device according to one embodiment of the present invention and a manufacturing method thereof.

Embodiments will be described in detail with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments. Note that the same portions or portions having similar functions are commonly denoted by the same reference numerals in different drawings, and repetitive description thereof is omitted.

Note that in each drawing described in this specification, the size, the layer thickness, or the region of each component is exaggerated for clarity in some cases. Therefore, embodiments of the present invention are not limited to such scales.

(Embodiment 1)

In this embodiment, configurations of a light-emitting device according to one embodiment of the present invention will be described with reference to FIGS. 1A to 1C and FIGS. 2A and 2B.

CONFIGURATION EXAMPLE

Figure 1B:
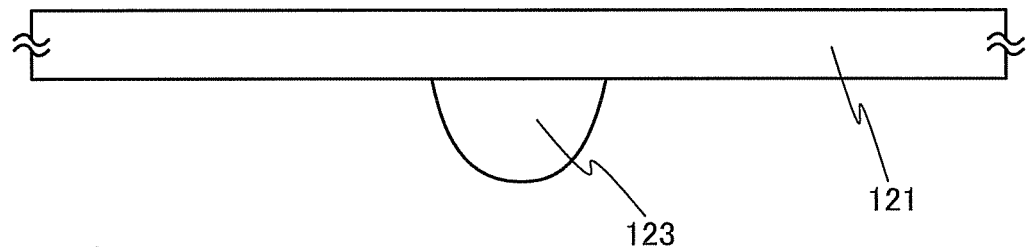
Figure 1C:
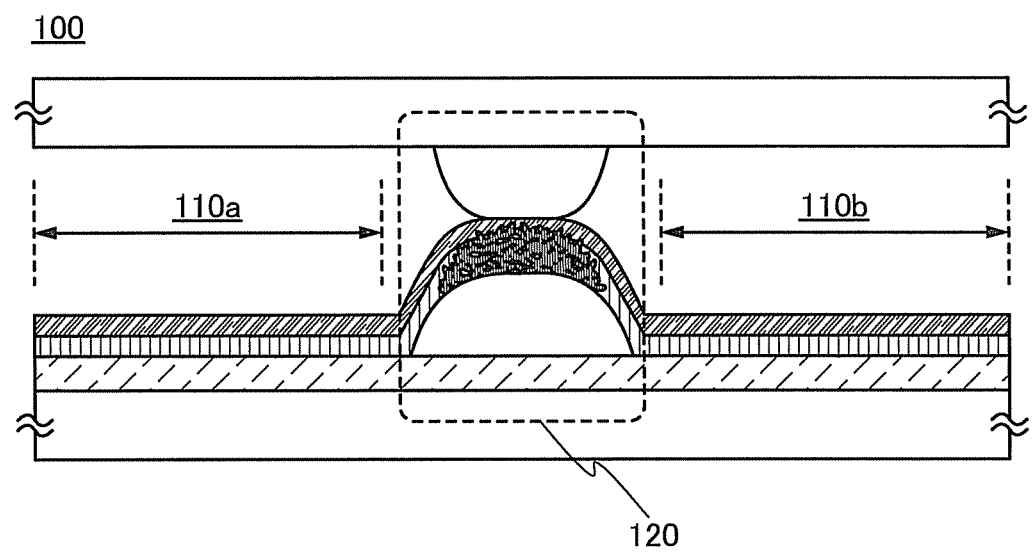

FIG. 1A is a schematic cross-sectional view of a substrate 101 over which an EL element in which a lower electrode layer 103, an EL layer 105, and an upper electrode layer 107 are stacked in that order and an auxiliary electrode for substantially increasing the conductivity of the upper electrode layer of the EL element are provided. FIG. 1B is a schematic cross-sectional view of a counter substrate 121 the surface of which is provided with a structure 123. FIG. 1C is a schematic cross-sectional view of a light-emitting device 100 which is formed by a combination of the substrate 101 in FIG. 1A and the counter substrate 121 in FIG. 1B.

First, a configuration illustrated in FIG. 1A will be described. Light-emitting regions (light-emitting regions 110a and 110b) in which the lower electrode layer 103, the EL layer 105, and the upper electrode layer 107 are stacked are formed over the substrate 101. Further, an insulating layer 109 and an auxiliary electrode layer 111 are stacked over the lower electrode layer 103.

The insulating layer 109 is provided for electrically insulating the auxiliary electrode layer 111 from the lower electrode layer 103. The insulating layer 109 preferably has a shape in which the thickness is smaller toward the edge portion, that is, a tapered shape. In particular, when the EL layer 105 is divided or thinned owing to the difference in level at the edge portion of the insulating layer 109, a short circuit between the upper electrode layer 107 and the lower electrode layer 103 might occur. Accordingly, it is preferable that the difference in level be gradually decreased toward the edge portion of the insulating layer 109.

The auxiliary electrode layer 111 has conductivity and has an uneven surface. It is preferable that the height difference between a depression and a projection of the uneven shape be substantially the same or greater than the thickness of the EL layer 105 to be formed. Here, the height difference between a depression and a projection of the uneven shape on a surface is the highest value among values each of which is obtained by subtracting the height of the lowest portion from the height of the highest portion in a depression and a projection adjacent to each other, on the whole surface. By such a very uneven shape, a region where the EL layer 105 is physically separated is likely to be formed. The height difference between a depression and a projection of the uneven shape is 1 time to 50 times, preferably 3 times to 50 times, further preferably 5 times to 50 times as thick as the thickness of the light-emitting region of the EL layer 105.

Note that the thickness of the EL layer 105 is exaggerated compared to the height difference between a depression and a projection on the uneven surface of the auxiliary electrode layer 111 in FIG. 1A for simplicity. The same applies to another drawing.

For example, the auxiliary electrode layer 111 having the above very uneven shape can be formed by a printing method such as a screen printing method. A conductive paste used in a printing method contains conductive particles, an organic resin, and an organic solvent, and a conductive structure can be formed as follows: the organic solvent is evaporated, part of the organic resin is decomposed, and the conductive particles are welded to each other, by heat treatment such as baking. The structure may be porous and have an uneven surface depending on a material of the organic resin or a particle diameter of the conductive particle. The particle diameter of the conductive particle is preferably greater than or equal to 5 nm and less than or equal to 50 μm, further preferably greater than or equal to 100 nm and less than or equal to 10 μm.

The auxiliary electrode layer 111 can also be formed in the following manner. A conductive film is formed by a film formation method such as a sputtering method, an evaporation method, or the like and then an unnecessary portion of the film is etched to form a pattern of the auxiliary electrode layer over the insulating layer 109. After that, a resist is formed in a slit pattern, a lattice pattern, or a dot pattern over a surface of the auxiliary electrode layer and the conductive film is subjected to half etching such that the conductive layer does not disappear; thus, an uneven shape can be formed. Alternatively, plasma treatment or reverse sputtering treatment may be performed on the surface to form an uneven shape.

The EL layer 105 is formed over the auxiliary electrode layer 111 having such an uneven surface, whereby the EL layer 105 is physically divided and the surface of the auxiliary electrode layer 111 is partly exposed. Subsequently, the upper electrode layer 107 is formed, whereby a region where an exposed portion of the auxiliary electrode layer 111 is physically in contact with the upper electrode layer 107 is formed.

Next, a configuration illustrated in FIG. 1B will be described. For the counter substrate 121, the structure 123 is provided in a position which overlaps with the auxiliary electrode layer 111 at the time of bonding the counter substrate 121 to the substrate 101.

In FIG. 1B, the structure 123 is a projection formed using an insulating material. Further, the structure 123 is preferably flexible enough to be deformed by external force applied when the counter substrate 121 is bonded to the substrate 101 and the structure 123 is in contact with the upper electrode layer 107 which is provided on the substrate 101 side and is over the auxiliary electrode layer 111. For example, an organic resin may be used. The structure 123 is deformed in accordance with the uneven surface of the auxiliary electrode layer 111 in bonding; thus, an area where the structure 123 is in close contact with the upper electrode layer 107 increases, so that the upper electrode layer 107 can be physically pressure-bonded to the auxiliary electrode layer 111 more efficiently.

Further, the structure 123 preferably contains a desiccant which absorbs moisture. In particular, in the case of using a top-emission light-emitting device, a non-light-emitting region thereof overlaps with the structure 123, whereby a desiccant can be introduced into a sealed region without reducing the area of a light-emitting region; thus, a highly reliable light-emitting device having high emission efficiency can be obtained.

Alternatively, a surface of the counter substrate 121 is processed to have projections, so that the counter substrate 121 can be used as the structure 123. The surface of the counter substrate 121 can be processed as follows: a resist is formed by a photolithography method, a droplet discharge method such as an ink-jet method, or a printing method such as a screen printing method over a region on the surface of the counter substrate 121 where projections are formed, and the surface is subjected to half etching such that the counter substrate 121 does not disappear. In the case where the counter substrate 121 is processed, the thickness of the light-emitting device 100 can be smaller by the thickness of the structure 123 compared to the case where the structure 123 is provided on the surface of the counter substrate 121.

FIG. 1C illustrates the light-emitting device 100 which is formed by bonding the counter substrate 121 to the substrate 101.

In a connection portion 120, a stack of the auxiliary electrode layer 111, the EL layer 105; and the upper electrode layer 107 is provided between the insulating layer 109 provided over the substrate 101 and the structure 123 provided over the counter substrate 121. Further, the upper electrode layer 107 is pressed from above by external force in bonding, so that the upper electrode layer 107 is electrically connected to the auxiliary electrode layer 111 without fail.

Accordingly, the auxiliary electrode layer 111 functions as an auxiliary electrode for substantially increasing the conductivity of the upper electrode layer 107. In this configuration, since the auxiliary electrode layer 111 can be formed over the substrate 101 before the EL layer 105 and the upper electrode layer 107 are formed, damage to the EL element caused when the auxiliary electrode is formed over the EL element can be prevented; thus, a highly reliable EL element can be obtained.

Further, in the connection portion 120, the auxiliary electrode layer 111 is insulated from the lower electrode layer 103 by the insulating layer 109, so that the upper electrode layer 107 can be insulated from the lower electrode layer 103 without fail.

Note that in order to use the auxiliary electrode layer 111 as the auxiliary electrode for substantially increasing the conductivity of the upper electrode layer 107, the auxiliary electrode layer 111 may be electrically insulated from the lower electrode layer 103. Thus, the auxiliary electrode layer 111 is not necessarily provided over the lower electrode layer 103, and the auxiliary electrode layer 111 may be formed in an opening portion which is provided in a region of the lower electrode layer 103, for example. Alternatively, the auxiliary electrode layer 111 may be provided in the peripheral portion of the lower electrode layer 103.

The auxiliary electrode with such a configuration is applied to the light-emitting device, whereby a highly reliable light-emitting device in which a voltage drop due to the resistance of the upper electrode layer is suppressed can be manufactured without using a metal mask for forming different patterns for the EL layer and the upper electrode layer.

Here, a connection portion in which an upper electrode layer of an EL element is connected to an auxiliary electrode layer having an uneven surface and in which a configuration is different from the above will be described.

MODIFICATION EXAMPLE

Figure 2A:
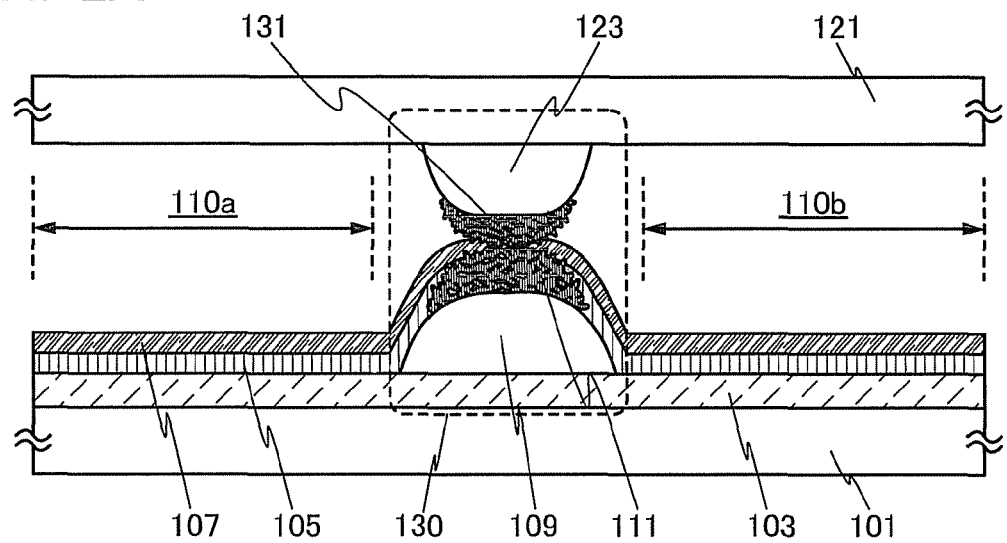
FIGS. 2A and 2B each illustrate a light-emitting device according to one embodiment of the present invention.

FIG. 2A is a schematic cross-sectional view of a light-emitting device including a connection portion 130 which has a different configuration from the above.

The connection portion 130 differs from the connection portion 120 in that a conductive connection electrode layer 131 is provided over the structure 123 which is provided over the counter substrate 121.

Similarly to the auxiliary electrode layer 111, the connection electrode layer 131 is preferably has an uneven surface. Note that the connection electrode layer 131 may be formed using a material and a method similar to those of the auxiliary electrode layer 111. With such a configuration, a contact area with the upper electrode layer 107 can be increased; thus, the contact resistance between the upper electrode layer 107 and the connection electrode layer 131 can be reduced. Note that part of the connection electrode layer 131 may be in contact with the auxiliary electrode layer 111.

Further, similarly to the auxiliary electrode layer 111, the connection electrode layer 131 functions as an auxiliary electrode for substantially increasing the conductivity of the upper electrode layer 107. Thus, with such a configuration in which the upper electrode layer 107 is provided between the auxiliary electrode layer 111 and the connection electrode layer 131, a highly reliable light-emitting device in which a voltage drop due to the resistance of the upper electrode layer 107 is suppressed more effectively can be obtained.

Figure 2B:
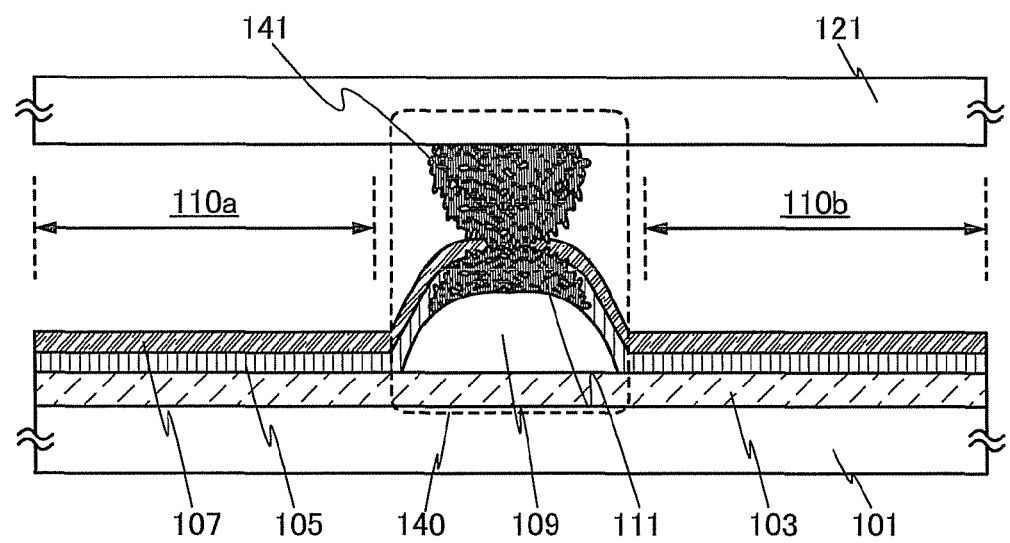

Alternatively, as in a connection portion 140 illustrated in FIG. 2B, a connection electrode layer 141 may be directly provided on the counter substrate 121 without the structure 123. Such a configuration is preferable because a step of forming the structure 123 can be omitted.

<Material and Manufacturing Method>

Here, materials which can be used for the components and manufacturing methods of the components will be described. Note that materials are not limited to one described below, and a material having a similar function can be used as appropriate.

[Substrate]

As a material of the substrate provided on the light-emission side, a light-transmitting material, such as glass, quartz, or an organic resin can be used. As a material of the substrate provided on the opposite side of the light-emission side, a light-transmitting property is not always necessary, and a material such as a metal, a semiconductor, ceramics, or a colored organic resin can be used other than the above material. In the case where a conductive substrate is used, the substrate preferably has an insulating property by oxidation of its surface or formation of an insulating film over the surface.

As a method by which a surface of a conductive substrate such as a metal substrate or an alloy substrate is insulated, an anodic oxidation method, an electrodeposition method, or the like can be used. In the case where an aluminum substrate is used as the substrate, for example, aluminum oxide formed over the surface by an anodic oxidation method has high insulating property and the aluminum oxide layer can be formed thin, which is preferable. An organic resin such as a polyamide-imide resin or an epoxy resin can be formed over the substrate surface by an electrodeposition method. Such an organic resin has a high insulating property and flexibility; thus, a crack hardly occurs in the surface even when the substrate is bent. When a material with high heat resistance is used, deformation of the substrate surface due to heat generated at the time of driving the light-emitting device can be suppressed.

In the case where an organic resin is used for the substrates, any of the following can be used as the organic resin, for example: polyester resins such as polyethylene terephthalate (PET) and polyethylene, naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, and the like. A substrate in which a glass fiber is impregnated with an organic resin or a substrate in which an inorganic filler is mixed with an organic resin can also be used.

In particular, in the case of a top-emission light-emitting device, as the substrate on the opposite side of the light-emission side where an EL element is formed, a high-thermal-conductive substrate such as a metal substrate is preferably used. In the case of a large lighting device including an EL element, heat from the EL element becomes a problem in some cases; thus, heat dissipation can be increased with the use of such a substrate having high thermal conductivity. For example, when a substrate of aluminum oxide, duralumin, or the like is used other than a stainless steel substrate, light weight and high thermal dissipation can be achieved. A stack of aluminum and aluminum oxide, a stack of duralumin and aluminum oxide, a stack of duralumin and magnesium oxide, or the like is preferably used because the surface of the substrate can have an insulating property.

[Light-Emitting Element]

As a light-transmitting material which can be used for an electrode layer through which light is extracted, indium oxide, indium tin oxide, indium zinc oxide, zinc oxide, zinc oxide to which gallium is added, graphene, or the like can be used.

Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used.

Alternatively, a nitride of the metal material (e.g., titanium nitride) or the like may be used. In the case of using the metal material (or the nitride thereof), the electrode layer may be thinned so as to be able to transmit light.

Alternatively, stacked films of any of the above materials can be used as the electrode layer. For example, stacked films of indium tin oxide and an alloy of silver and magnesium is preferably used because conductivity can be increased.

The thickness of the electrode layer through which light is extracted is, for example, greater than or equal to 50 nm and less than or equal to 300 nm, preferably greater than or equal to 80 nm and less than or equal to 130 nm, further preferably greater than or equal to 100 nm and less than or equal to 110 nm.

The EL layer includes at least a layer containing a light-emitting organic compound. In addition, the EL layer can have a stacked-layer structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate.

Note that in one embodiment of the present invention, a light-emitting element (tandem light-emitting element) in which a plurality of EL layers is provided between an upper electrode layer and a lower electrode layer can be used. A stacked-layer structure of two layers, three layers, or four layers (in particular, a stacked-layer structure of three layers) is preferably used. In addition, an intermediate layer containing a substance having a high electron transport property, a substance having a high hole transport property, or the like can be included between these EL layers. Configuration examples of the EL layer will be described in detail in Embodiment 4.

An electrode layer which is provided on the side opposite to the side from which light is extracted is formed using a reflective material. As the reflective material, a metal such as aluminum, gold, platinum, silver, nickel, tungsten, chromium, molybdenum, iron, cobalt, copper, lanthanum, or palladium, or an alloy containing at least one of these metals can be used. For example, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. Aluminum can be used for the material of the electrode layer; however, in that case, the wiring might be corroded when the wiring is provided to be in direct contact with indium tin oxide or the like. Thus, it is preferable that the electrode layer have a stacked-layer structure and that aluminum be used for a layer which is not in contact with indium tin oxide or the like.

Note that a conductive film used for the light-emitting element can be formed by a film formation method such as an evaporation method, a sputtering method, a CVD method, or the like. In addition, the EL layer can be formed by a film formation method such as an evaporation method or a droplet discharge method such as an ink-jet method.

[Insulating Layer, Structure]

As a material of the insulating layer provided over the substrate or the structure provided over the counter substrate, for example, an organic resin such as a polyimide resin, an acrylic resin, a polyamide resin, or an epoxy resin or an inorganic insulating material can be used. There is no particular limitation on the methods for forming the insulating layer and the structure. A sputtering method, an evaporation method, a droplet discharge method (e.g., an ink-jet method), a printing method (e.g., a screen printing method or an offset printing method), or the like may be used.

Further, a desiccant may be contained in the structure. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the desiccant.

[Auxiliary Electrode Layer, Connection Electrode Layer]

In the case of forming the auxiliary electrode layer and the connection electrode layer by a printing method such as a screen printing method, a conductive paste in which conductive particles having a diameter of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti) and the like, fine particles of silver halide, or dispersible nanoparticles can be used. As the organic resin included in the conductive paste, one or more selected from organic resins serving as a binder of metal particles, a solvent, a dispersing agent and a coating material can be used. Organic resins such as an epoxy resin and a silicone resin can be given as representative examples. Further, in forming a conductive film, baking is preferably performed after the conductive paste is printed.

In the case where the conductive film is formed by a film formation method such as a sputtering method or a CVD method and then is selectively etched, a conductive material which is used for the light-emitting element can be used for the conductive film, as appropriate.

This embodiment can be combined with any of the other embodiments disclosed in this specification as appropriate.

(Embodiment 2)

In the case where a light-emitting device is manufactured without using a metal mask, an EL layer and an upper electrode layer are stacked over a wiring which is provided over a substrate, but it is difficult to electrically connect the wiring and the upper electrode layer to each other with the EL layer provided therebetween. However, when the auxiliary electrode layer described as an example in Embodiment 1 is used as a connection electrode, the upper electrode layer and the wiring can be formed without using a metal mask and can be electrically connected to each other.

Figure 3:
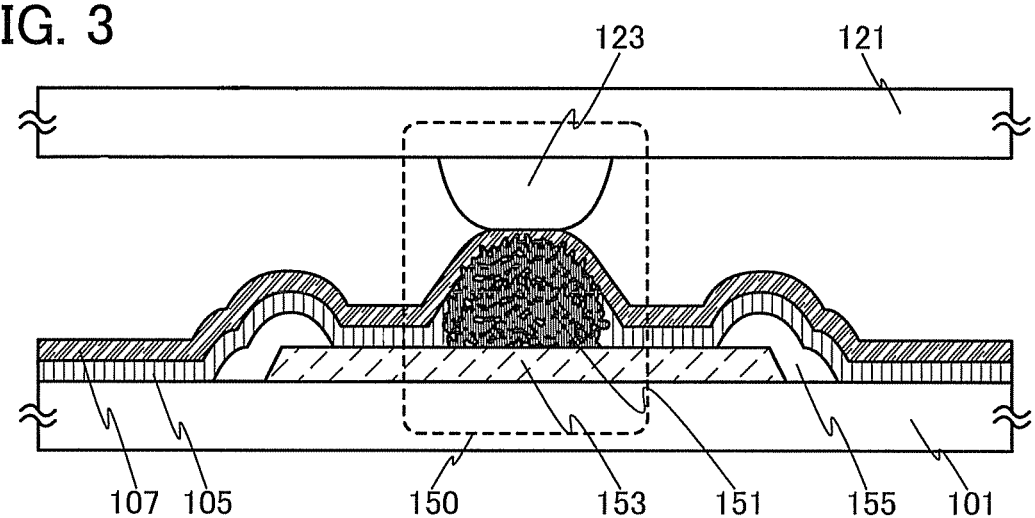
FIG. 3 illustrates a light-emitting device according to one embodiment of the present invention.

In this embodiment, a configuration of a connection portion of the upper electrode layer and the wiring provided over the substrate will be described with reference to FIG. 3. FIG. 3 is a schematic cross-sectional view of a region including a connection portion 150 of the wiring and the upper electrode layer in the light-emitting device which is formed by bonding the counter substrate 121 to the substrate 101.

A wiring 153 is provided over the substrate 101 to be connected to the upper electrode layer 107 of the EL element. An edge portion of the wiring 153 is covered with a partition 155. Further, a connection electrode layer 151 is provided on and in contact with the wiring 153. Furthermore, the EL layer 105 and the upper electrode layer 107 which cover the partition 155, the wiring 153, and the connection electrode layer 151 are formed.

The structure 123 is provided over the counter substrate 121, as in Embodiment 1.

The wiring 153 can be formed using the same material as the lower electrode layer 103 described as an example in Embodiment 1. The wiring 153 is preferably formed using the same material as the lower electrode layer 103 because the process can be simplified. Note that the wiring 153 may be formed using a different material having lower resistance than the material of the lower electrode layer 103.

The partition 155 is provided to prevent disconnection of the EL layer 105, the upper electrode layer 107, and the like over the wiring 153, which is due to the difference in level at the edge portion of the wiring 153. Note that the partition 155 is not necessarily provided.

As a material of the partition 155, for example, an organic resin such as a polyimide resin, an acrylic resin, a polyamide resin, or an epoxy resin or an inorganic insulating material can be used. It is particularly preferable that the partition be formed using a photosensitive resin material to have an opening portion so that a side surface of the opening portion is formed as an inclined surface with continuous curvature. Specifically, the radius of curvature of a curve drawn by a cross section of the partition is desirably approximately 0.2 μm to 2 μm. There is no particular limitation on the method for forming the partition. A sputtering method, an evaporation method, a droplet discharge method (e.g., an ink-jet method), a printing method (e.g., a screen printing method or an offset printing method), or the like may be used.

The connection electrode layer 151 can be formed over the wiring 153, using a material and a method similar to those of the auxiliary electrode layer 111 described as an example in Embodiment 1.

The connection electrode layer 151 is formed on and in contact with and is electrically connected to the wiring 153. Thus, when the counter substrate 121 is bonded to the substrate 101 and the structure 123 is in contact with the upper electrode layer 107 from above the upper electrode layer 107, the upper electrode layer 107 is electrically connected to the wiring 153 without fail through the connection electrode layer 151.

With such a configuration, even when the EL layer and the upper electrode layer are formed without using a metal mask, the wiring formed over the substrate can be electrically connected to the upper electrode layer without fail. A light-emitting device including the connection portion 150 can be a highly reliable light-emitting device in which a problem caused by a metal mask is prevented.

Note that as an example in Embodiment 1, the connection electrode layer having the uneven shape may be provided over the structure 123 provided over the counter substrate 121. Alternatively, the connection electrode layer may be formed without providing the structure 123. The connection electrode layer is preferably provided also on the counter substrate side because the resistance of the connection portion can be lowered.

This embodiment can be combined with any of the other embodiments disclosed in this specification as appropriate.

(Embodiment 3)

In this embodiment, specific configurations of a light-emitting device to which the auxiliary electrode layer or the connection electrode layer described as an example in any of the above embodiments is applied will be described with reference to FIG. 4, FIG. 5, FIGS. 6A and 6B, FIG. 7, and FIG. 8.

CONFIGURATION EXAMPLE 1

Figure 4:
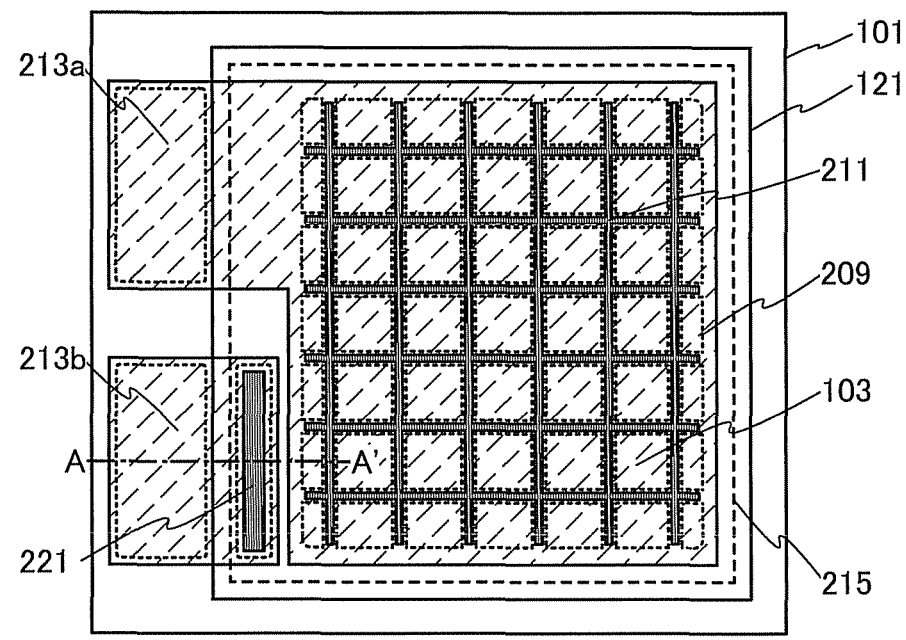
FIG. 4 illustrates a light-emitting device according to one embodiment of the present invention.
Figure 5:
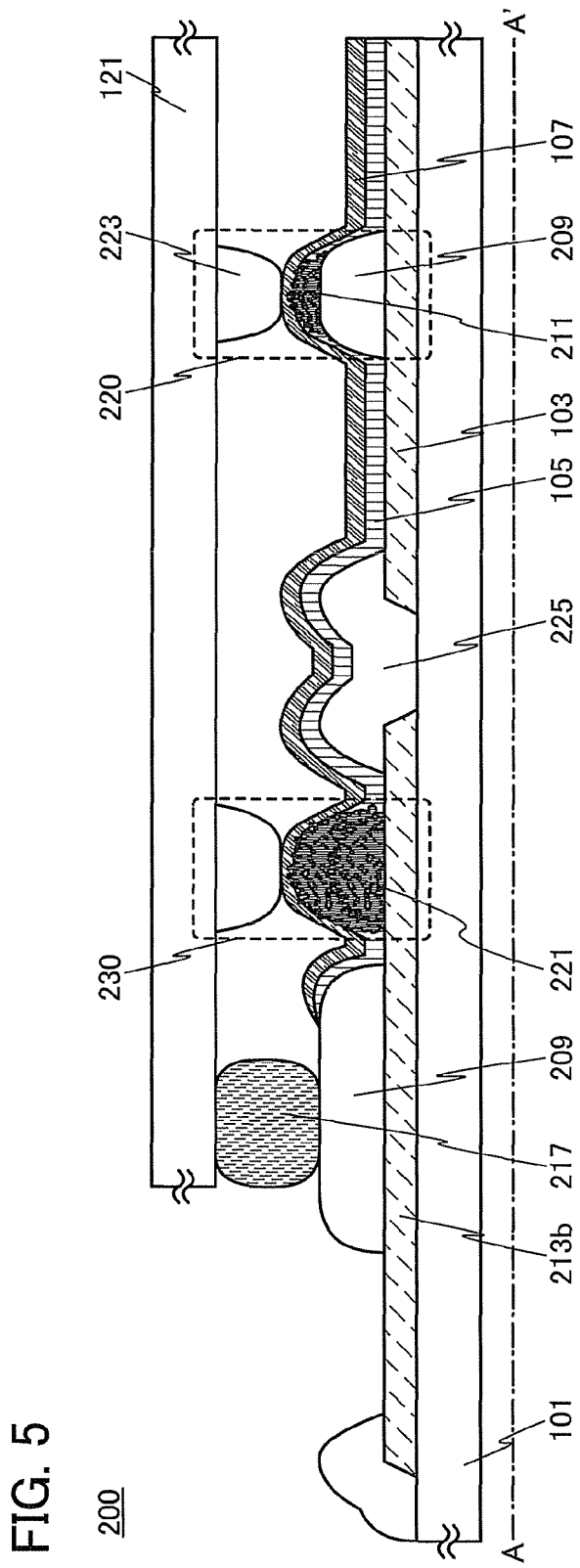
FIG. 5 illustrates the light-emitting device according to one embodiment of the present invention.

FIG. 4 is a schematic top view of a light-emitting device 200 according to one embodiment of the present invention. FIG. 5 is a schematic cross-sectional view taken along line A-A' in FIG. 4. Note that for simplicity, FIG. 4 illustrates only components such as a substrate, a variety of wirings, a lower electrode layer, an auxiliary electrode layer, and a connection electrode layer described later.

The light-emitting device 200 includes an EL element in which the lower electrode layer 103, the EL layer 105, and the upper electrode layer 107 are stacked in that order over the substrate 101.

Part of the lower electrode layer 103 is formed outside a region where the counter substrate 121 is provided and the part forms a wiring 213a for supplying power to the EL element. Similarly, a wiring 213b which is electrically connected to the upper electrode layer 107 through a connection electrode layer 221 is formed in a region outside the counter substrate 121.

The EL layer 105 and the upper electrode layer 107 are formed inside a film formation region 215 surrounded by a dashed line in FIG. 4 without using a metal mask. Thus, inside the film formation region 215, the EL layer 105 and the upper electrode layer 107 are stacked.

The counter substrate 121 is bonded to the substrate 101 with a sealant 217 and an insulating layer 209 provided therebetween in a region outside the film formation region 215.

The insulating layer 209 and an auxiliary electrode layer 211 are stacked over the lower electrode layer 103. Here, the insulating layer and the auxiliary electrode layer each described as an example in Embodiment 1 can be applied to the insulating layer 209 and the auxiliary electrode layer 211, respectively. Thus, the EL layer 105 formed over the auxiliary electrode layer 211 is physically divided by an uneven surface of the auxiliary electrode layer 211 and the auxiliary electrode layer 211 is partly exposed, and the upper electrode layer 107 formed thereover is partly in contact with and electrically connected to the auxiliary electrode layer 211.

Further, a structure 223 provided over the counter substrate 121 so as to face the auxiliary electrode layer 211 is physically in contact with the upper electrode layer 107 from above the upper electrode layer 107, so that a connection portion 220 in which the upper electrode layer 107 is electrically connected to the auxiliary electrode layer 211 without fail is formed. Here, the configuration of the connection portion described as an example in Embodiment 1 can be applied to that of the connection portion 220.

Furthermore, the connection electrode layer 221 is provided on and in contact with the wiring 213b. In a connection portion 230, over the connection electrode layer 221, the EL layer 105, the upper electrode layer 107 formed over the EL layer 105, and the structure 223 provided over the counter substrate 121 so as to face the upper electrode layer 107 are provided. Here, the configuration of the connection portion described as an example in Embodiment 2 can be applied to that of the connection portion 230. Accordingly, the wiring 213b is electrically connected to the upper electrode layer 107 without fail through the connection electrode layer 221.

Note that since edge portions of the lower electrode layer 103 and the wirings 213a and 213b are each covered with a partition 225, a short circuit with the upper electrode layer 107 due to the difference in level at the edge portion is prevented. Further, in a region where the wiring 213a and the wiring 213b are outside the counter substrate 121, opening portions are formed in the partition 225 so that surfaces of the wiring 213a and the wiring 213b are exposed.

In this embodiment, the partition 225 and the insulating layer 209 are formed using the same material in the same step. The partition 225 and the insulating layer 209 are preferably formed in the same step at the same time because the process can be simplified. Note that in the case where the partition 225 and the insulating layer 209 need to have different thicknesses, for example, the partition 225 and the insulating layer 209 may be formed in different steps.

The sealant 217 is provided in the peripheral portion of the counter substrate 121 and bonds the substrate 101 and the counter substrate 121 to each other. As a method for forming the sealant 217, a printing method such as a screen printing method, a droplet discharge method such as an ink-jet method, a coating method such as a dispensing method, and the like can be given.

A known material can be used for the sealant 217. For example, a thermosetting material or a UV curable material may be used. Alternatively, an epoxy resin of a two-component-mixture type may be used. For the sealant 217, a material capable of bonding inorganic materials, organic materials, or an inorganic material and an organic material is used in accordance with an adhesion site. Further, it is desirable that a material used for the sealant 217 allow as little moisture and oxygen as possible to penetrate through. Furthermore, a desiccant may be contained in the sealant 217. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the desiccant.

Although the insulating layer 209 is provided below the sealant 217 in this embodiment, the sealant 217 may be in direct contact with the substrate 101 and the counter substrate 121.

Here, in the case where an alternating-current power source such as a household power source is used as an external power source which is connected to the light-emitting device including the EL element, a power conversion device such as an AC-DC converter is preferably connected between the external power source and the light-emitting device. For example, an AC-DC converter converts an alternating current voltage output from an alternating-current power source such as a household power source into a direct current voltage adjusted to a voltage suitable for driving the light-emitting device. When an AC-DC converter is provided over the substrate over which the light-emitting device is provided, the light-emitting device can be easily introduced into equipment to which a conventional fluorescent light, light bulb, or the like is connected. A configuration example in which a converter is provided over a substrate over which a light-emitting device is provided will be described below.

Figure 6A:
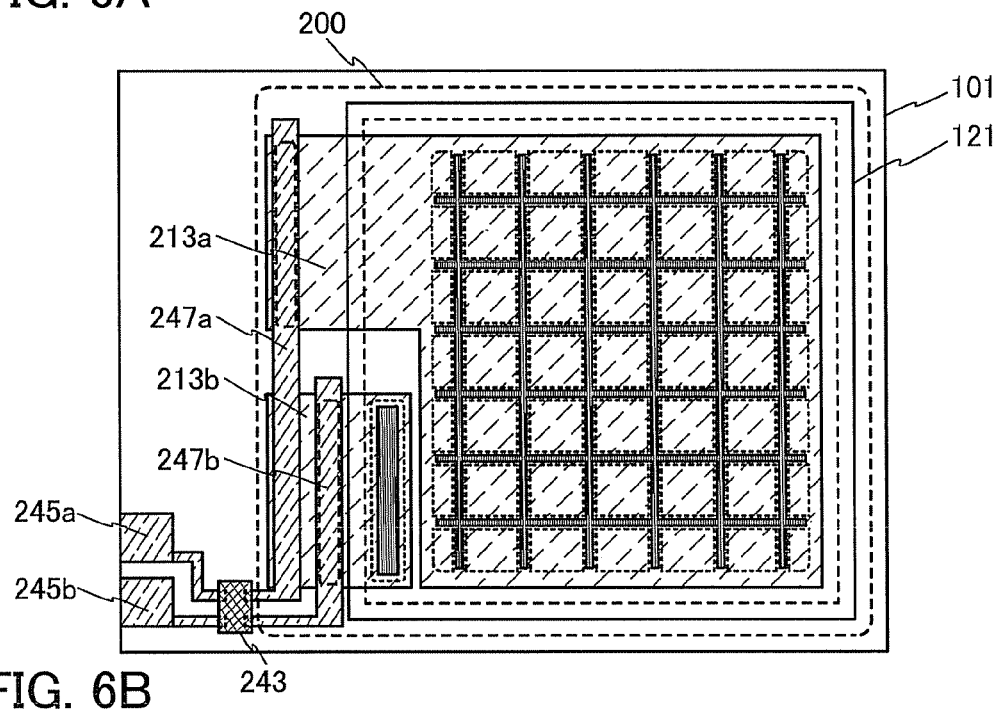
FIGS. 6A and 6B each illustrate a light-emitting device according to one embodiment of the present invention.

FIG. 6A illustrates a configuration example in which the light-emitting device 200 and a converter are provided over one substrate. The light-emitting device 200, a converter 243, and connection electrodes 245a and 245b are provided over the substrate 101. Input terminals of the converter 243 are electrically connected to the connection electrodes 245a and 245b for connecting to a household power source or the like. One of two output terminals of the converter 243 is electrically connected to the wiring 213a of the light-emitting device 200 through a wiring 247a, and the other of the output terminals is electrically connected to the main wiring 213b through a wiring 247b. Note that the wiring 247a is electrically connected to the wiring 213a through the opening portion in the partition 225, and the wiring 247b is electrically connected to the wiring 213b through the opening portion in the partition 225.

As the converter 243, an AC-DC converter for converting an alternating current voltage from a household power source or the like into a direct current voltage adjusted to a voltage suitable for driving the light-emitting device 200 can be used. The converter 243 is electrically connected to the wirings 213a and 213b of the light-emitting device 200 and supplies the converted direct current voltage to the light-emitting device 200 to drive the light-emitting device 200.

Figure 6B:
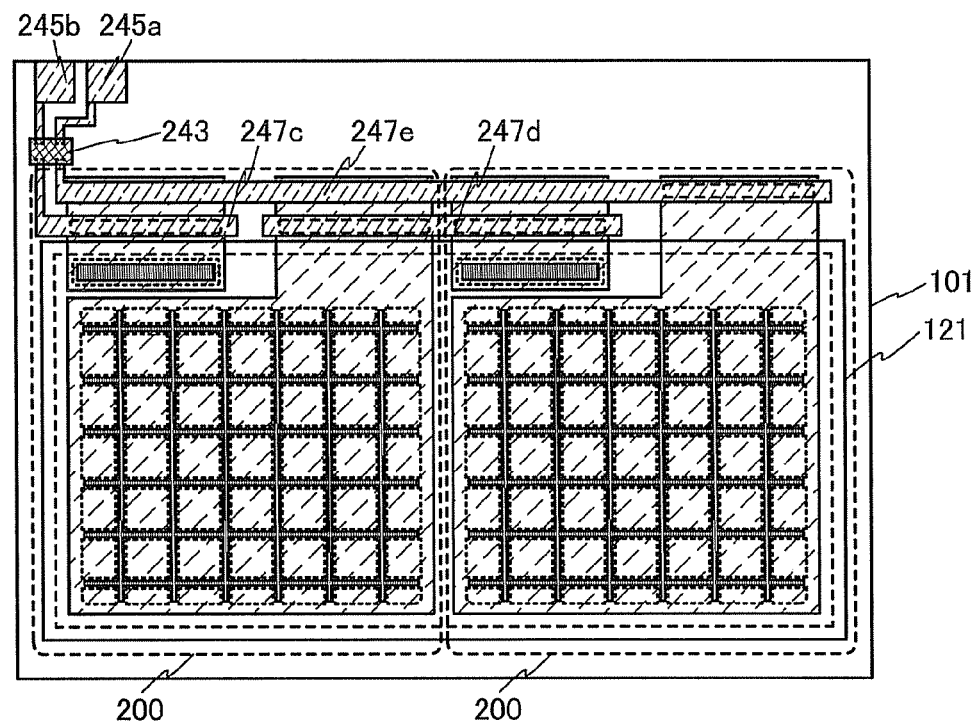

Further, a configuration as illustrated in FIG. 6B may be employed in which a pair of the light-emitting devices 200 is provided over the substrate 101 and the wirings of the light-emitting devices 200 are connected in series using external wirings (wirings 247c, 247d, and 247e) so that the pair of the light-emitting devices 200 is driven by one converter 243. The pair of the light-emitting devices 200 is connected in series and thus an effective driving voltage of the entire device can be increased, so that power conversion efficiency of the converter 243 can be improved as compared to the case of using one light-emitting device. Note that two light-emitting devices are connected in series here; however, three or more light-emitting devices may be connected in series or a plurality of light-emitting devices may be connected in parallel. Alternatively, a plurality of light-emitting devices may be connected in combination of a series connection and a parallel connection. When a plurality of light-emitting devices is connected to each other, the number of converters 243 with respect to one light-emitting device can be reduced, which is preferable.

The above is the description of the configuration of the light-emitting device 200.

Next, one embodiment of a light-emitting device which is different from the above will be described as an example.

CONFIGURATION EXAMPLE 2

In many cases, in an AC-DC converter which converts a household alternating current voltage into a direct current voltage for driving a light-emitting device, conversion efficiency tends to decrease as a voltage level after the conversion is smaller. In view of the above, a plurality of EL light-emitting devices is connected in series to increase an effective driving voltage of the entire device, so that conversion efficiency of an AC-DC converter can be improved. One embodiment of a light-emitting device in which a plurality of EL elements is connected in series will be described below.

Note that description of the common portions to those of the light-emitting device 200 will be omitted here.

Figure 7:
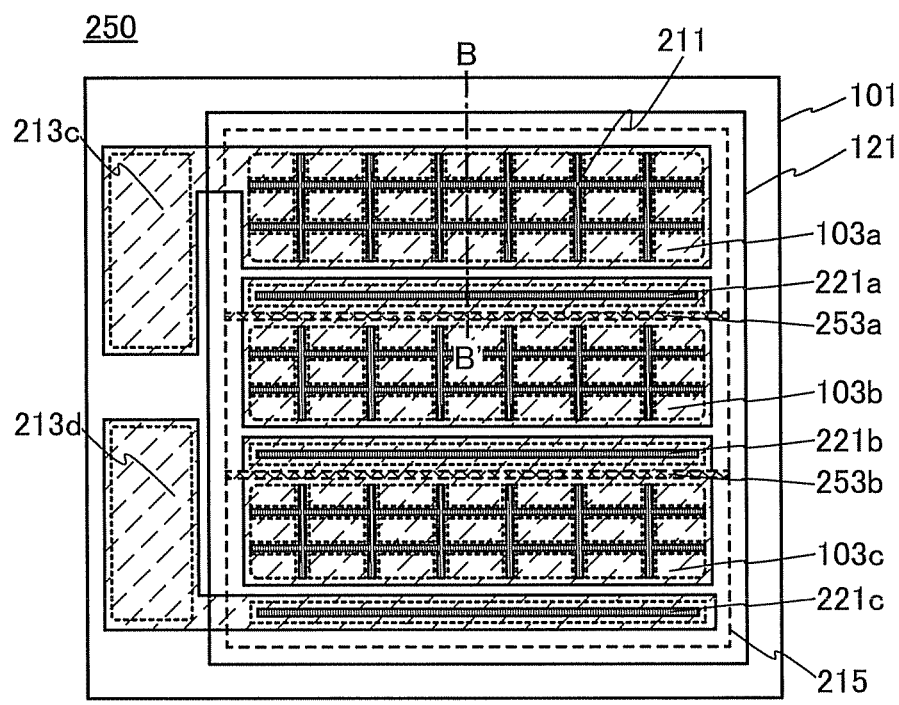
FIG. 7 illustrates a light-emitting device according to one embodiment of the present invention.
Figure 8:
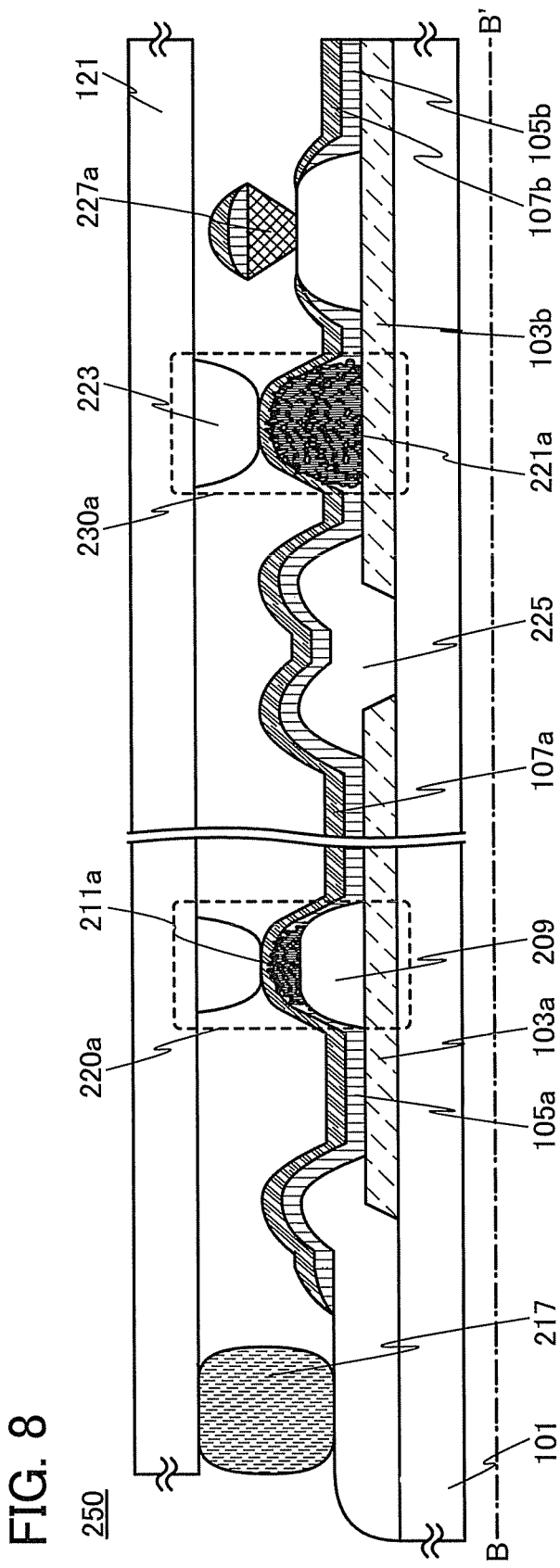
FIG. 8 illustrates the light-emitting device according to one embodiment of the present invention.

A light-emitting device 250 illustrated in FIG. 7 and FIG. 8 is a light-emitting device in which three EL elements are connected in series. FIG. 7 is a schematic top view of the light-emitting device 250. FIG. 8 is a schematic cross-sectional view taken along line B-B' in FIG. 7. Note that for simplicity, FIG. 7 illustrates only components such as a substrate, a variety of wirings, a lower electrode layer, an auxiliary electrode layer, a connection electrode layer, and a separation layer.

In a region outside the counter substrate 121, part of a first lower electrode layer 103a forms a wiring 213c which is connected to an external power source or the like. Further, part of a wiring 213d is formed inside a region where the counter substrate 121 is provided, and is electrically connected to a third upper electrode layer 107c (not illustrated) through a connection electrode layer 221c in the region.

A first EL layer 105a and a first upper electrode layer 107a are formed over the first lower electrode layer 103a to form a first EL element. Similarly, a second EL layer 105b and a second upper electrode layer 107b are formed over a second lower electrode layer 103b to form a second EL element, and a third EL layer 105c (not illustrated) and the third upper electrode layer 107c are formed over a third lower electrode layer 103c to form a third EL element.

Here, the insulating layer 209 and an auxiliary electrode layer 211a are formed over the first lower electrode layer 103a. In addition, the structure 223 is formed in a region which is on the counter substrate 121 and overlaps with the auxiliary electrode layer 211a to form a connection portion 220a. In the connection portion 220a, the first upper electrode layer 107a is electrically connected to the auxiliary electrode layer 211a without fail; thus, the auxiliary electrode layer 211a can substantially increase the conductivity of the first upper electrode layer 107a.

Similarly, a connection portion 220b (not illustrated) including an auxiliary electrode layer 211b is formed over the second lower electrode layer 103b, and a connection portion 220c (not illustrated) including an auxiliary electrode layer 211c is faulted over the third lower electrode layer 103c.

A separation layer 227a is formed over the second lower electrode layer 103b with the insulating layer 209 provided therebetween. A film fainted over the separation layer 227a is physically divided by the separation layer 227a.

As the separation layer 227a, an insulating structure whose side surface has an inverted tapered shape can be used. The separation layer 227a may have a T-shape. When a film is formed over the separation layer 227a having such a shape, the film is not formed in a region covered with a portion where the side surface of the separation layer 227a protrudes in a direction parallel to a formation surface. Accordingly, the formed film can be physically divided by the separation layer 227a.

The separation layer 227a can be formed, for example, using a negative photosensitive organic resin by light exposure and development treatment. At this time, light-exposure conditions are adjusted so that the amount of light exposure is smaller in a region closer to the substrate 101; thus, the separation layer 227a having an inverted tapered shape can be formed. Alternatively, a light-exposure area and light-exposure conditions are adjusted and light exposure may be performed more than once, so that the T-shaped separation layer 227a is formed. Further alternatively, films formed using a plurality of materials may be stacked and processed by a photolithography method. In that case, the stack may be etched utilizing a difference in etching rate so that the side surface of a lower layer is recessed; thus, the T-shaped separation layer 227a is formed.

As described above, an EL layer formed over the separation layer 227a is physically divided into the EL layer 105a and the EL layer 105b by the separation layer 227a provided over the second lower electrode layer 103b. Further, the upper electrode layer 107a is physically and electrically separated from the upper electrode layer 107b.

In addition, a connection portion 230a is provided in a region between the separation layer 227a and the first EL element. In the connection portion 230a, the connection electrode layer 221a is formed over and electrically connected to the second lower electrode layer 103b. Furthermore, the structure 223 which faces the connection electrode layer 221a is provided over the counter substrate 121. Thus, in the connection portion 230a, the upper electrode layer 107a is electrically connected to the lower electrode layer 103b through the connection electrode layer 221a.

As described above, the connection portion 230a and the separation layer 227a are provided over the second lower electrode layer 103b, whereby the first EL layer is connected in series with the second EL layer.

In a similar manner, a separation layer 227b (not illustrated) and a connection portion 230b (not illustrated) including a connection electrode layer 221b are provided over the third lower electrode layer 103c, whereby the second EL element is connected in series with the third EL element.

Further, a connection portion 230c (not illustrated) including the connection electrode layer 221c is provided over the wiring 213d, so that in the connection portion 230c, the upper electrode layer 107c of the third EL element is electrically connected to the wiring 213d without fail.

In this manner, all of the wiring 213c, the first EL element, the second EL element, the third EL element, and the wiring 213d are connected in series. Thus, when a voltage is applied between the wirings 213c and 213d, the light-emitting device 250 in which the three EL elements are connected in series can be driven.

Here, when films to be the EL layer and the upper electrode layer are formed inside the film formation region 215 surrounded by a dashed line in FIG. 7 without using a metal mask, the EL layer and the upper electrode layer are stacked inside the film formation region 215. However, when the auxiliary electrode layer or the connection electrode layer according to one embodiment of the present invention is provided in the connection portion as described above, the auxiliary electrode layer or the connection electrode layer can be electrically connected to the upper electrode layer without fail even when the EL layer is provide therebetween. Accordingly, the EL layer and the upper electrode layer can be formed without using a metal mask and thus, a problem caused by the metal mask is prevented and a highly reliable light-emitting device can be obtained.

In the light-emitting device 250 with such a configuration, a plurality of EL elements is connected in series, whereby an effective driving voltage is increased. Accordingly, a decrease in conversion efficiency of an AC-DC converter which is connected to the light-emitting device 250 is reduced and thus, a light-emitting device with low power consumption can be obtained. Further, the auxiliary electrode electrically connected to the upper electrode layers of the EL elements without fail can substantially increase the conductivity of the upper electrode layers of the EL elements and a light-emitting device in which a voltage drop due to the resistance of the upper electrode layers is suppressed can be obtained.

In the light-emitting device described as an example in this embodiment, the auxiliary electrode layer functions as an auxiliary electrode for substantially increasing the conductivity of the upper electrode layer; thus, even when an area of a light-emitting portion of the light-emitting device is large, a voltage drop due to the resistance of the upper electrode layer is suppressed and a highly reliable light-emitting device in which distribution of light-emission luminance is improved can be obtained. Further, when the connection electrode layer is formed over the wiring which is electrically connected to the upper electrode layer, the EL layer and the upper electrode layer can be formed without using a metal mask; thus, a problem in the case of using a metal mask is prevented and a light-emitting device can have higher reliability.

This embodiment can be combined with any of the other embodiments disclosed in this specification as appropriate.

(Embodiment 4)

In this embodiment, an example of an EL layer which can be applied to one embodiment of the present invention will be described with reference to FIGS. 9A to 9C.

Figure 9A:
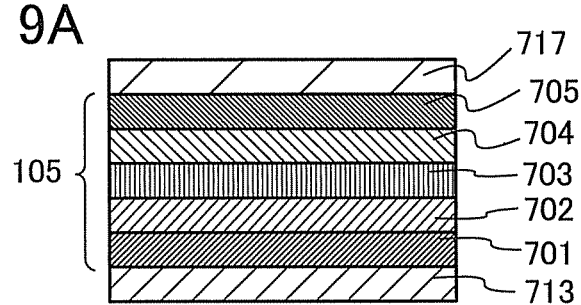
FIGS. 9A to 9C each illustrate an EL layer according to one embodiment of the present invention.

As illustrated in FIG. 9A, the EL layer 105 is provided between a first electrode layer 713 and a second electrode layer 717. The first electrode layer 713 and the second electrode layer 717 can have configurations similar to those of the lower electrode layer and the upper electrode layer in any of the above embodiments.

A light-emitting element including the EL layer 105 described as an example in this embodiment can be used in any of the light-emitting devices described as examples in the above embodiments.

The EL layer 105 includes at least a light-emitting layer containing a light-emitting organic compound. In addition, the EL layer 105 can have a stacked-layer structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, in the EL layer 105, a hole injection layer 701, a hole transport layer 702, a layer 703 containing a light-emitting organic compound, an electron transport layer 704, and an electron injection layer 705 are stacked in that order from the first electrode layer 713 side. Note that the stacking order may be inversed.

A method for manufacturing the light-emitting element illustrated in FIG. 9A will be described.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$) or copper(II) phthalocyanine (abbreviation: CuPc) can also be used.

Alternatively, an aromatic amine compound which is a low molecular organic compound, or the like can be used.

Further alternatively, a high molecular compound (e.g., an oligomer, a dendrimer, or a polymer) can be used. A high molecular compound to which acid is added can also be used.

In particular, for the hole injection layer 701, a composite material in which an organic compound having a high hole transport property is mixed with an acceptor substance is preferably used. With the use of the composite material in which a substance having a high hole transport property is mixed with an acceptor substance, excellent hole injection from the first electrode layer 713 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the first electrode layer 713 to the EL layer 105 is facilitated.

As the organic compound for the composite material, any of a variety of compounds such as an aromatic amine compound, a carbazole derivative, aromatic hydrocarbon, and a high molecular compound (e.g., an oligomer, a dendrimer, and a polymer) can be used. The organic compound used for the composite material is preferably an organic compound having a high hole transport property. Specifically, a substance having a hole mobility of $10^{-6}$ $cm^2/V \cdot s$ or higher is preferably used. Note that any other substance may be used as long as the hole transport property thereof is higher than the electron transport property thereof.

As the organic compound that can be used for the composite material, an aromatic amine compound, a carbazole derivative, or an aromatic hydrocarbon compound having a high hole mobility can be used.

Examples of an electron acceptor include an organic compound and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting properties. Among these, molybdenum oxide is particularly preferable because it is stable in the air, has a low hygroscopic property, and is easily handled.

The composite material may be formed using the high molecular compound and the above electron acceptor and used for the hole injection layer 701.

The hole transport layer 702 is a layer containing a substance having a high hole transport property. As the substance having a high hole transport property, an aromatic amine compound can be used, for example. The substance is mainly one that has a hole mobility of $10^{-6}$ $cm^2/V \cdot s$ or higher. Note that any other substance may be used as long as the hole transport property thereof is higher than the electron transport property thereof. Note that the layer containing the substance having a high hole transport property is not limited to a single layer and may be formed of a stack of two or more layers containing any of the above substances.

For the hole transport layer 702, a carbazole derivative, an anthracene derivative, or a high molecular compound having a high hole transport property may be used.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a configuration in which the light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

As the host material, plural kinds of materials can be used. For example, in order to suppress crystallization, a substance which suppresses crystallization may be added. In addition, a different kind of substance may be further added in order to efficiently transfer energy to a guest material.

When a configuration in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can also be used.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron transport layer 704 is a layer containing a substance having a high electron transport property. The substance having a high electron transport property is mainly one that has an electron mobility of $10^{-6}$ cm$^2$/V·s or higher. The electron transport layer is not limited to a single layer and may be formed of a stack of two or more layers containing the above substance.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. The above substance for forming the electron transport layer 704 can also be used.

Note that the hole injection layer 701, the hole transport layer 702, the layer 703 containing a light-emitting organic compound, the electron transport layer 704, and the electron injection layer 705 which are described above can each be formed by an evaporation method (e.g., a vacuum evaporation method), an ink-jet method, a coating method, or the like.

Figure 9B:
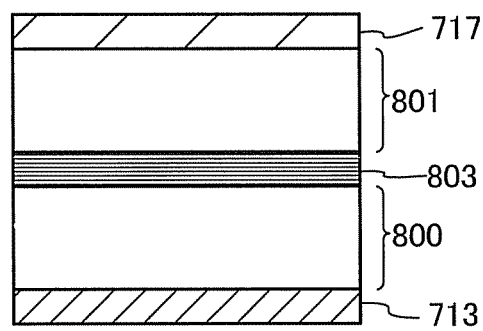

Note that a plurality of EL layers may be stacked between the first electrode layer 713 and the second electrode layer 717 as illustrated in FIG. 9B. In that case, a charge generation layer 803 is preferably provided between a first EL layer 800 and a second EL layer 801 which are stacked. The charge generation layer 803 can be formed using the above-mentioned composite material. The charge generation layer 803 may have a stacked-layer structure including a layer containing the composite material and a layer containing another material. In that case, as the layer containing another material, a layer containing an electron donating substance and a substance having a high electron transport property, a layer formed using a transparent conductive film, or the like can be used. As for a light-emitting element having such a configuration, problems such as energy transfer and quenching are less likely to occur, and thus a light-emitting element which has both high light luminous efficiency and long lifetime can be easily obtained owing to expansion in the choice of materials. Moreover, a light-emitting element which provides phosphorescence from one EL layer and fluorescence from another EL layer can be readily obtained. Note that this configuration can be combined with the above-mentioned configurations of the EL layer.

Further, by forming EL layers to emit light of different colors from each other, light emission of a desired color can be obtained from the light-emitting element as a whole. For example, in a light-emitting element including two EL layers, the emission color of a first EL layer and the emission color of a second EL layer are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more EL layers.

Figure 9C:
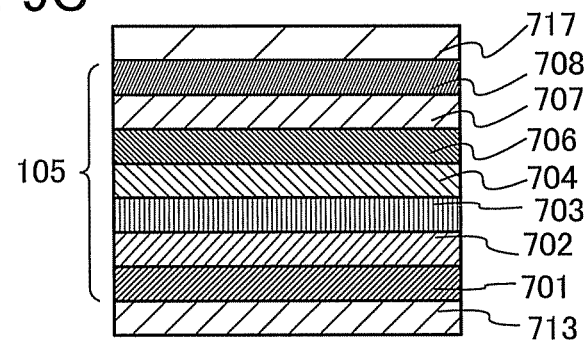

As illustrated in FIG. 9C, the EL layer 105 may include the hole injection layer 701, the hole transport layer 702, the layer 703 containing a light-emitting organic compound, the electron transport layer 704, an electron injection buffer layer 706, an electron relay layer 707, and a composite material layer 708 which is in contact with the second electrode layer 717, between the first electrode layer 713 and the second electrode layer 717.

It is preferable to provide the composite material layer 708 which is in contact with the second electrode layer 717 because damage caused to the EL layer 105 particularly when the second electrode layer 717 is faulted by a sputtering method can be reduced. The composite material layer 708 can be fainted using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having a high electron injection property can be used for the electron injection buffer layer 706: an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The configuration in which the electron relay layer 707 is provided between the composite material layer 708 and the electron injection buffer layer 706 is a configuration in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably higher than or equal to −5.0 eV, more preferably higher than or equal to −5.0 eV and lower than or equal to −3.0 eV.

As the substance having a high electron transport property contained in the electron relay layer 707, a phthalocyanine-based material or a metal complex having a metal-oxygen bond and an aromatic ligand is preferably used.

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. In particular, a material having a high acceptor property, in which a metal-oxygen double bond is more likely to act on another molecular in terms of a molecular structure is preferably used.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, in addition to the material described above as the substance having a high electron transport property, a substance having a LUMO level higher than the acceptor level of the acceptor substance contained in the composite material layer 708 can be used. Specifically, it is preferable to use a substance having a LUMO level of higher than or equal to −5.0 eV, more preferably higher than or equal to −5.0 eV and lower than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the layer 703 containing a light-emitting organic compound, and the electron transport layer 704 may each be formed using any of the above materials.

In the above manner, the EL layer 105 according to this embodiment can be formed.

This embodiment can be combined with any of the other embodiments disclosed in this specification as appropriate.

(Embodiment 5)

In this embodiment, examples of a lighting device including a light-emitting device according to one embodiment of the present invention will be described with reference to FIGS. 10A and 10B.

According to one embodiment of the present invention, a lighting device in which a light-emitting portion has a curved surface can be obtained.

The light-emitting device according to one embodiment of the present invention can be used for lighting in a car; for example, lighting can be provided for a dashboard, a ceiling, or the like.

Figure 10A:
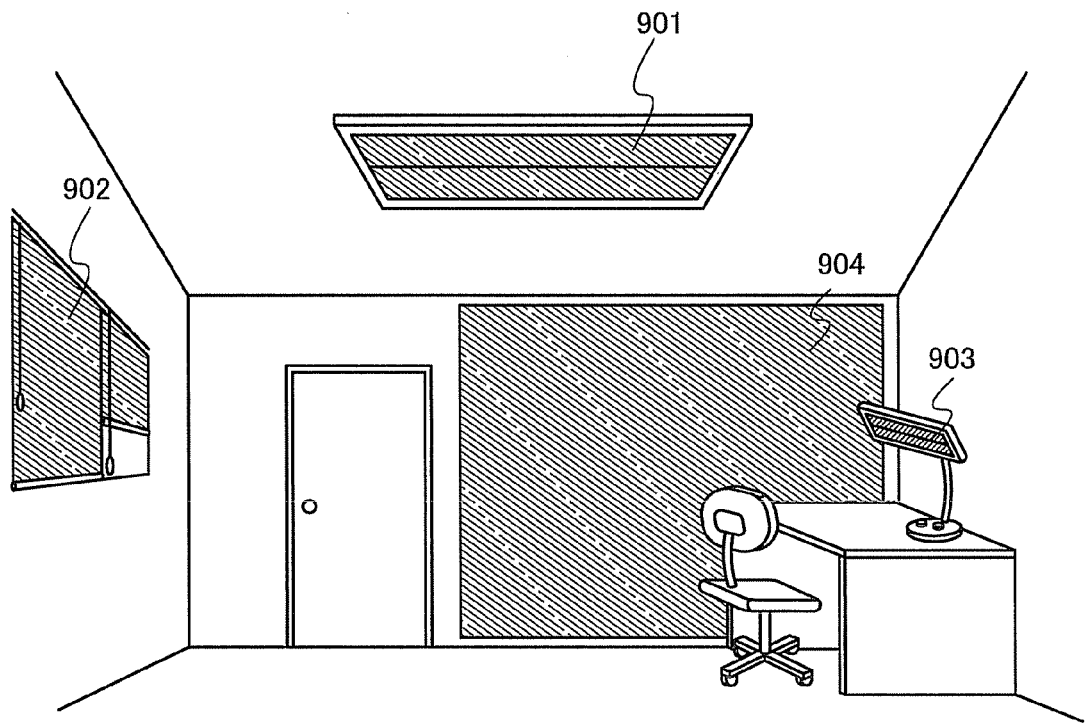
FIGS. 10A and 10B illustrate lighting devices according to one embodiment of the present invention.

FIG. 10A illustrates an interior lighting device 901, a desk lamp 903, and a planar lighting device 904 to which the light-emitting device according to one embodiment of the present invention is applied. Since the light-emitting device can have a larger area, it can be used as a lighting device having a large area. Further, since the light-emitting device is thin, the light-emitting device can be mounted on a wall. Furthermore, the light-emitting device can be used as a roll-type lighting device 902.

Figure 10B:
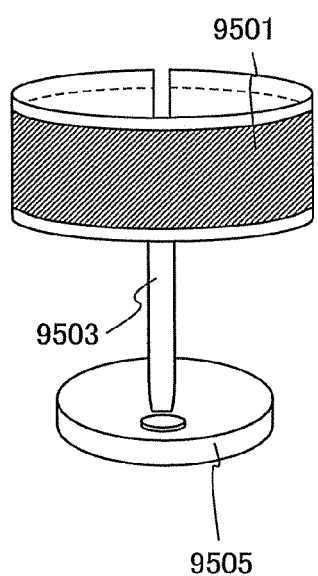

FIG. 10B illustrates another example of the lighting device. A desk lamp illustrated in FIG. 10B includes a lighting portion 9501, a support 9503, a support base 9505, and the like. The lighting portion 9501 includes the light-emitting device according to one embodiment of the present invention. As described above, according to one embodiment of the present invention, a lighting device having a curved surface or a lighting device including a flexible lighting portion can be obtained. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be combined with any of the other embodiments disclosed in this specification as appropriate.

This application is based on Japanese Patent Application serial no. 2011-075866 filed with Japan Patent Office on Mar. 30, 2011, the entire contents of which are hereby incorporated by reference.

What is claimed is:

1. A light-emitting device comprising:
a first electrode layer over a first substrate;
an insulating layer over the first electrode layer;
a conductive connection electrode layer comprising an uneven shape over the insulating layer;

a layer containing a light-emitting organic compound over the first electrode layer and the conductive connection electrode layer so that the conductive connection electrode layer is partially exposed through the layer over the conductive connection electrode layer;

a second electrode layer over the layer containing the light-emitting organic compound;

a structure over the second electrode layer; and a second substrate over the structure, wherein the second electrode layer is interposed between the conductive connection electrode layer and the structure, and wherein the second electrode layer is electrically connected to the conductive connection electrode layer by the structure to press the second electrode layer over the conductive connection electrode layer.

2. The light-emitting device according to claim 1, wherein the structure comprises a projection, and wherein the structure has conductivity.

3. The light-emitting device according to claim 1, wherein the structure comprises a first insulating layer and a conductive layer, wherein the conductive layer is electrically connected to the second electrode layer, and wherein the first insulating layer is interposed between the conductive layer and the second substrate.

4. The light-emitting device according to claim 1, wherein the first electrode layer reflects light emitted from the layer containing the light-emitting organic compound, and wherein the second electrode layer transmits light emitted from the layer containing the light-emitting organic compound.

5. The light-emitting device according to claim 1, wherein the conductive connection electrode layer comprising the uneven shape comprises a conductive particle being greater than or equal to 100 nm and less than or equal to 10,000 nm in diameter.

6. A method for manufacturing a light-emitting device, comprising the steps of:

forming a first electrode layer over a first substrate;

forming an insulating layer over the first electrode layer;

forming a conductive connection electrode layer comprising an uneven shape over the insulating layer;

forming a layer containing a light-emitting organic compound over the first electrode layer and the conductive connection electrode layer so that the conductive connection electrode layer is partially exposed through the layer over the conductive connection electrode layer;

forming a second electrode layer over the layer containing the light-emitting organic compound;

preparing a second substrate provided with a structure; and bonding the second substrate to the first substrate so that the second electrode layer is interposed between the conductive connection electrode layer and the structure, wherein the second electrode layer is electrically connected to the conductive connection electrode layer by the structure to press the second electrode layer over the conductive connection electrode layer.

7. The method for manufacturing the light-emitting device according to claim 6, wherein the structure comprises a projection, and wherein the structure has conductivity.

8. The method for manufacturing the light-emitting device according to claim 6, further comprising the step of:

forming a conductive layer over the structure, wherein the conductive layer is interposed between the second electrode layer and the structure, and wherein the conductive layer is electrically connected to the second electrode layer.

9. The method for manufacturing the light-emitting device according to claim 6, wherein the conductive connection electrode layer comprising the uneven shape is formed with a conductive paste including a conductive particle being greater than or equal to 100 nm and less than or equal to 10,000 nm in diameter.

* * * * *